US012661879B2

(12) United States Patent
Kim et al.

(10) Patent No.: US 12,661,879 B2
(45) Date of Patent: Jun. 23, 2026

(54) PROTECTIVE FILM AND DISPLAY DEVICE INCLUDING THE SAME

(71) Applicant: Samsung Display Co., Ltd., Yongin-Si (KR)

(72) Inventors: Hongju Kim, Hwaseong-si (KR); Euiyoung Kim, Yongin-si (KR); Youngdae Song, Busan (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/904,355

(22) Filed: Oct. 2, 2024

(65) Prior Publication Data

US 2025/0018679 A1     Jan. 16, 2025

Related U.S. Application Data

(62) Division of application No. 17/373,959, filed on Jul. 13, 2021, now Pat. No. 12,134,254.

(30) Foreign Application Priority Data

Oct. 19, 2020     (KR) ........................ 10-2020-0135343

(51) Int. Cl.
| | |
|---|---|
| *B32B 7/12* | (2006.01) |
| *B32B 3/26* | (2006.01) |
| *B32B 27/08* | (2006.01) |
| *B32B 27/28* | (2006.01) |
| *B32B 27/32* | (2006.01) |

(Continued)

(52) U.S. Cl.
CPC ............ *B32B 27/281* (2013.01); *B32B 3/266* (2013.01); *B32B 7/12* (2013.01); *B32B 27/08* (2013.01); *B32B 27/32* (2013.01); *B32B 27/36* (2013.01); *H10K 59/871* (2023.02); *B32B*

*2457/20* (2013.01); *H10K 59/12* (2023.02); *H10K 59/87* (2023.02); *H10K 59/873* (2023.02)

(58) Field of Classification Search
None
See application file for complete search history.

(56) References Cited

U.S. PATENT DOCUMENTS

| | | | |
|---|---|---|---|
| 2013/0183472 A1 | 7/2013 | Kang et al. | |
| 2014/0130339 A1 | 5/2014 | Shin | |

(Continued)

FOREIGN PATENT DOCUMENTS

| | | |
|---|---|---|
| CN | 103809802 A | 5/2014 |
| CN | 107464800 A | 12/2017 |

(Continued)

OTHER PUBLICATIONS

Table of Polymer Properties from Handbook of Polymers 2nd Edition (Year: 2016).*

(Continued)

*Primary Examiner* — Laura C Powers
(74) *Attorney, Agent, or Firm* — CANTOR COLBURN LLP

(57) ABSTRACT

A protective film comprises a first film layer, a second film layer disposed on a first surface of the first film layer, and an adhesive layer disposed on a second surface of the first film layer, which is opposite to the first surface, and a through hole is defined through the second film layer to expose the first surface of the first film layer.

9 Claims, 12 Drawing Sheets

(51) Int. Cl.
    *B32B 27/36*        (2006.01)
    *H10K 59/12*        (2023.01)
    *H10K 59/80*        (2023.01)

(56)          References Cited

U.S. PATENT DOCUMENTS

| 2016/0120023 | A1 | 4/2016 | Choi et al. |
| 2017/0062756 | A1 | 3/2017 | Ahn et al. |
| 2017/0352692 | A1 | 12/2017 | Lee et al. |
| 2020/0290325 | A1 | 9/2020 | Cheon |
| 2021/0237399 | A1 | 8/2021 | Lee et al. |

FOREIGN PATENT DOCUMENTS

| KR | 20170024230 | A | 3/2017 |
| KR | 101801688 | B1 | 11/2017 |
| KR | 101801689 | B1 | 11/2017 |
| KR | 101801690 | B1 | 11/2017 |
| KR | 20180000822 | A | 1/2018 |
| KR | 1020180009224 | A | 1/2018 |

OTHER PUBLICATIONS

Chinese Office Action for Chinese Application No. 202111209355.
8; Report Mail Date Apr. 1, 2026 (12 Pages—with Translation)

\* cited by examiner

PROTECTIVE FILM AND DISPLAY DEVICE INCLUDING THE SAME

This application is a divisional of U.S. patent application Ser. No. 17/373,959, filed on Jul. 13, 2021, which claims priority to Korean Patent Application No. 10-2020-0135343, filed on Oct. 19, 2020, and all the benefits accruing therefrom under 35 U.S.C. § 119, the content of which in its entirety is herein incorporated by reference.

BACKGROUND

1. Field

Embodiments of the invention relate generally to a protective film. More specifically, embodiments of the invention relate to a protective film for protecting a window including a curved area.

2. Description of the Related Art

A display device may emit light to display an image. The display device may include a display panel emitting light and a window disposed on the display panel. In general, the display device may be manufactured by separately manufacturing the window and the display panel, and then attaching the display panel to a lower surface of the window.

A protective film may be attached on the window. The window to which the protective film is attached can be transported to another location. The protective film may be removed before attaching the display panel to the lower surface of the window. Until the protective film is removed, the protective film can protect the window from external forces and impurities. After attaching the display panel to the lower surface of the window, the protective film may be attached to the window again.

Recently, a display device having a curved edge has been developed, and accordingly, a window including a curved area has been developed. Therefore, a protective film for stably protecting a window including a curved area is required to develop.

SUMMARY

Some embodiments provide a protective film for stably protecting a window including a curved area.

Some embodiments provide a display device including the protective film.

According to an embodiment, a protective film includes a first film layer, a second film layer disposed on a first surface, and an adhesive layer disposed on a second surface of the first film layer, which is opposite to the first surface, where a through hole is defined through the second film layer to expose the first surface of the first film layer.

In an embodiment, the second film layer may include a central area and an outer area surrounding the central area, and the through hole may be defined in the outer area.

In an embodiment, the through hole may be adjacent to an edge of the central area.

In an embodiment, an elongation rate of the first film layer may be greater than an elongation rate of the second film layer.

In an embodiment, the first film layer may include polyethylene ("PE").

In an embodiment, the second film layer may include polyethylene terephthalate ("PET").

In an embodiment, the second film layer may further include a first film piece disposed inside the through hole and having a circular shape, a second film piece surrounding the first film piece, and a third film piece extending from the first film piece to the second film piece.

In an embodiment, the second film layer may further include a plurality of first film extensions disposed inside the through hole and extending in a first direction, and a plurality of second film extensions disposed inside the through hole and extending in a second direction perpendicular to the first direction.

In an embodiment, the second film layer may further include a plurality of film patterns disposed inside the through hole and having a hexagonal shape.

In an embodiment, the second film layer may further include a film pattern disposed inside the through hole and having a spiral shape.

In an embodiment, the protective film may further include a third film layer disposed on the second film layer, wherein an elongation rate of the third film layer is greater than an elongation rate of the second film layer.

According to an embodiment, a display device includes a display panel, a window disposed on the display panel, and a protective film disposed on the window, where the protective film includes a first film layer, a second film layer disposed on a first surface, and adhesive layer disposed on a second surface of the first film layer, which is opposite to the first surface, where a through hole is defined through the second film layer to expose the first surface of the first film layer.

In an embodiment, the window may include a flat area and a curved area surrounding the flat area, and the through hole may be defined in the curved area.

In an embodiment, an elongation rate of the first film layer is greater than an elongation rate of the second film layer.

In an embodiment, the first film layer may include PE.

In an embodiment, the second film layer may include PET.

In an embodiment, the second film layer may further include a first film piece disposed inside the through hole and having a circular shape, a second film piece surrounding the first film piece, and a third film piece extending from the first film piece to the second film piece.

In an embodiment, the second film layer may further include a plurality of first film extensions disposed inside the through hole and extending in a first direction, and a plurality of second film extensions disposed inside the through hole and extending in a second direction perpendicular to the first direction.

In an embodiment, the second film layer may further include a plurality of film patterns disposed inside the through hole and having a hexagonal shape.

In an embodiment, the second film layer may further include a film pattern disposed inside the through hole and having a spiral shape.

In embodiments of the invention, the protective film may include the first film layer, the second film layer disposed on the first surface of the first film layer, and the adhesive layer disposed on the second surface opposite to the first surface. In such embodiments, the through hole may be defined through the second film layer to expose the first surface of the first film layer. In such embodiments, the protective film may be disposed on the window, and the through hole may be defined in the curved area of the window. In such embodiments, the elongation rate of the first film layer is greater than the elongation rate of the second film layer, and the first film layer may be disposed between the window and the second film layer.

Accordingly, in such embodiments, when the protective film is attached to the window including the curved area, the first film layer may be in close contact with the curved area, and air bubbles may not be generated between the window and the protective film. In such embodiments, stains may not occur in the curved area of the window, such that the window may be stably protected.

BRIEF DESCRIPTION OF THE DRAWINGS

Illustrative, non-limiting embodiments will be more clearly understood from the following detailed description in conjunction with the accompanying drawings.

DETAILED DESCRIPTION

Figure 1:
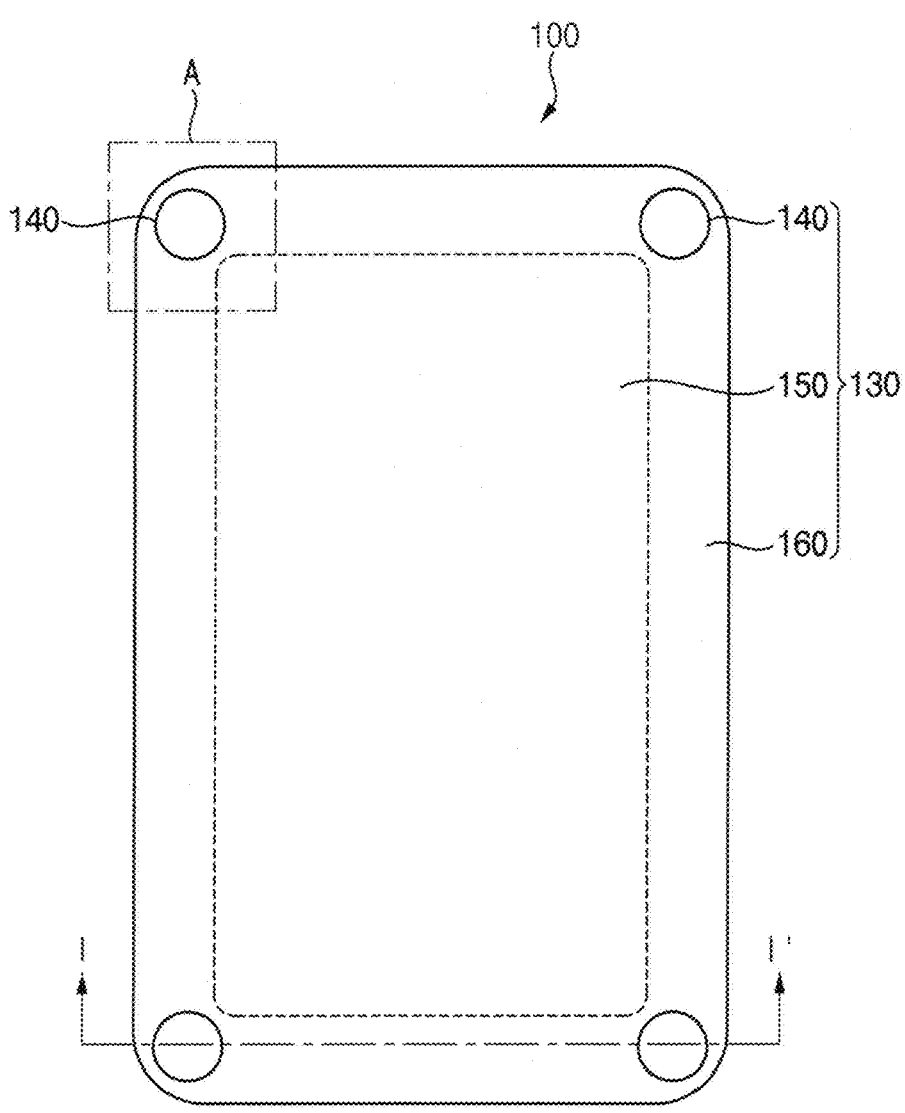
FIG. 1 is a plan view illustrating a protective film according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

Figure 2:
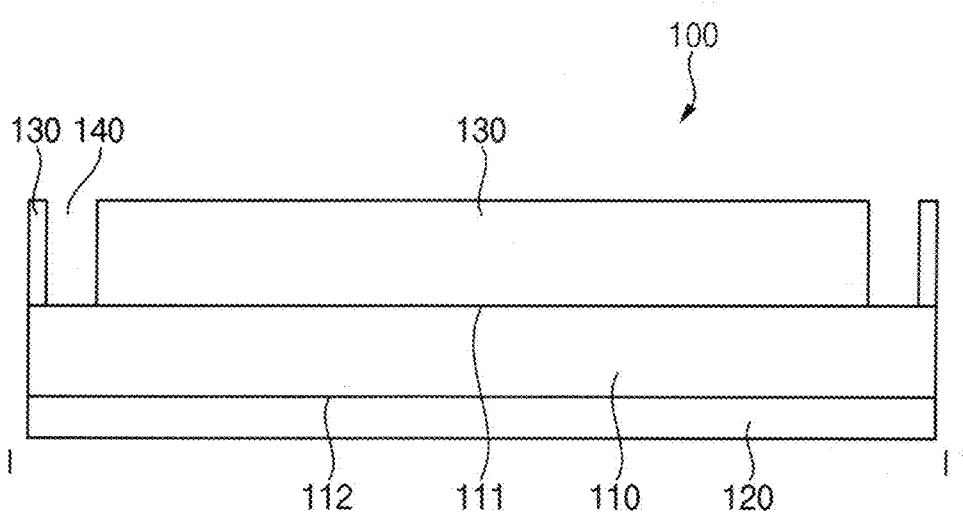
FIG. 2 is a cross-sectional view taken along line I-I' of FIG. 1.

FIG. 1 is a plan view illustrating a protective film according to an embodiment. FIG. 2 is a cross-sectional view taken along line I-I' of FIG. 1.

Referring to FIGS. 1, and 2, an embodiment of a protective film 100 may include a first film layer 110, an adhesive layer 120 and a second film layer 130, where a through hole 140 is defined through the second film layer 130.

Figure 9:
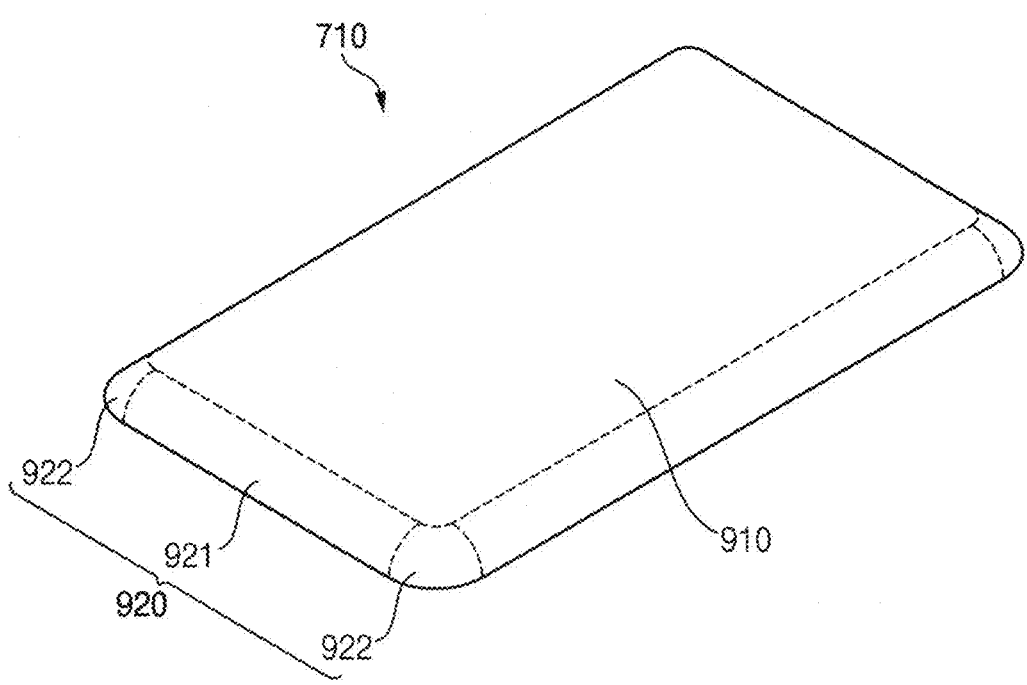
FIG. 9 is a perspective view illustrating the window included in the display device of FIG. 7B.

The first film layer 110 may be adhered in close contact with a curved area (for example, a curved area 920 in FIG. 9) on a window (for example, a window 710 in FIG. 9). In an embodiment, an elongation rate of the first film layer 110 may be in a range from about 600% to about 1200%. In one embodiment, for example, the first film layer 110 may include polyethylene ("PE"). In such an embodiment, when the first film layer 110 including PE is attached to the window, the first film layer 110 may be stretched, and the first film layer 110 may be in close contact with the window in the curved area.

In an embodiment, the elongation rate of the first film layer 110 may be greater than an elongation rate of the second film layer 130. In one embodiment, for example, the elongation rate of the first film layer 110 may be about 480% or more. In one embodiment, for example, the first film layer 110 may include polyimide ("PI") or polyurethane ("PU").

A thickness of the first film layer 110 is not particularly limited, and may be set in a range of, for example, about 25 micrometers (μm) to about 100 μm. A hardness of the first film layer 110 is not particularly limited, and for example, the first film layer 110 may have a shore D hardness of about 60 D.

The adhesive layer 120 may be disposed on a second surface 112 of the first film layer 110. The adhesive layer 120 may provide adhesive force to the protective film 100. A type of the adhesive included in the adhesive layer 120 is not particularly limited, and the adhesive layer 120 may include an adhesive known in the art. In one embodiment, for example, the adhesive layer 120 may include an acrylic adhesive, a silicone adhesive, or an acid-free type of a hydroxyl-containing adhesive. A thickness of the adhesive layer 120 is not particularly limited, and for example, the thickness of the adhesive layer 120 may be about 25 μm. An adhesive force of the adhesive layer 120 may be in a range from about 2 gram force per millimeter (gf/mm) to about 110 gf/mm.

The second film layer 130 may be disposed on a first surface 111 opposed to the second surface 112. A hardness of the second film layer 130 may be greater than the hardness of the first film layer 110. The second film layer 130 may include at least one selected from polyethylene terephthalate ("PET"), polypropylene ("PP"), polyepoxy, cyclic olefin polymer ("COP"), cyclic olefin copolymer ("COC"), polycarbonate resin and cyclic olefin-based polymer copolymer, polycarbonate-based resin and cyclic olefin-based copolymer, polymethyl methacrylate ("PMMA"), polycarbonate ("PC"), polyvinyl chloride, triacetylcellulose, and polyethylene naphthalate. A thickness of the second film layer 130 is not particularly limited, and may be set in a range of, for example, about 25 μm to about 100 μm.

In an embodiment, the second film layer 130 may include PET having a Rockwell hardness of about R102, and may have a thickness of about 50 μm.

In an embodiment, the through hole 140 may be defined through the second film layer 130. The through hole 140 may expose the first surface 111 of the first film layer 110. The position, size and shape of the through hole 140 on the protective film 100 may be variously adjusted by removing the material constituting the second film layer 130 (for example, PET). In an embodiment, the window (for example, a window 710 of FIG. 9) may include an area including multiple curved surfaces, that is, an area curved with a plurality of radii of curvature (for example, a second curved area 922 of FIG. 9). The protective film 100 may be attached on the window. In an embodiment of the protective film 100 according to the invention, the position, size, and shape of the through hole 140 may be adjusted to be similar to the position, size, and shape of the area including multiple curved surfaces. Accordingly, the lifting of the second film layer 130 may not occur in a portion overlapping the area including multiple curved surfaces of on the window.

In an embodiment, the second film layer 130 may include a central area 150 and an outer area 160 surrounding the central area 150, and the through hole 140 may be defined through the outer area 160. The central area 150 of the second film layer 130 may be disposed on a flat area (for example, a flat area 910 of FIG. 9) of the window (for example, a window 710 of FIG. 9). The outer area 160 of the second film layer 130 may be disposed on a curved area (for example, a curved area 920 of FIG. 9) of the window. In an embodiment, the through hole 140 may be disposed on the area where multiple curved surfaces overlap on the window. Accordingly, the lifting of the second film layer 130 may not occur in the area including multiple curved surfaces on the window.

In an embodiment, the through hole 140 may be adjacent to the edge of the central area 150. Accordingly, the second film layer 130 may not be lifted at the edge of the window (for example, the window 710 of FIG. 9) including the curved area.

Figure 3A:
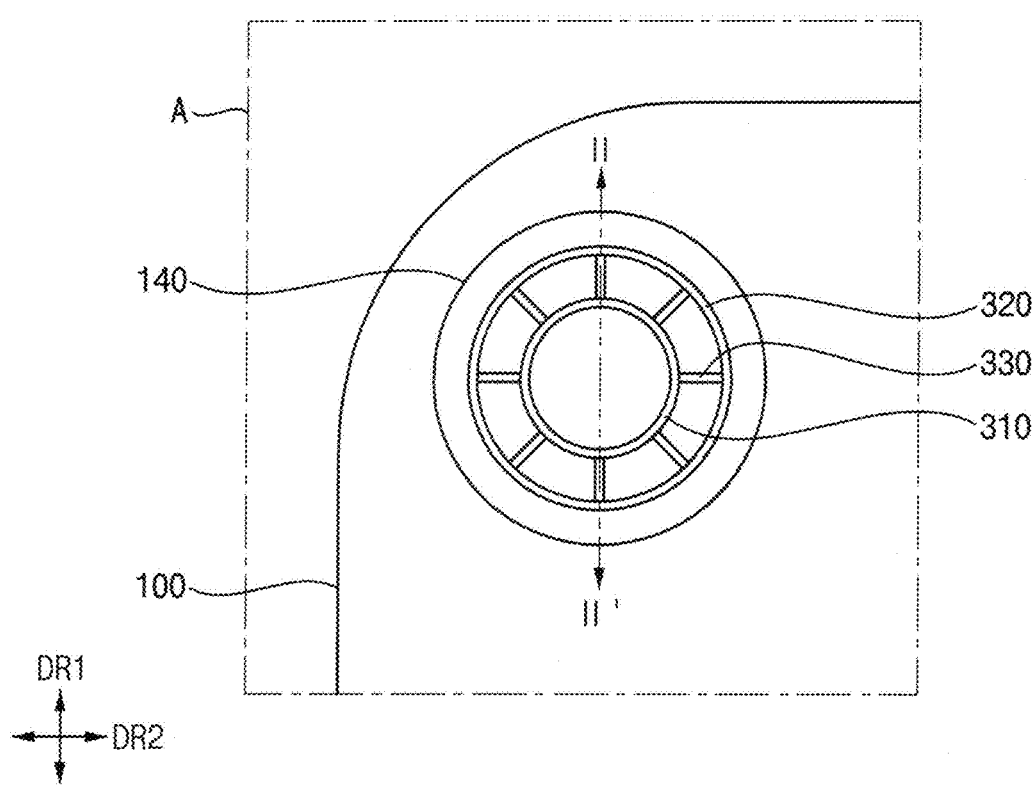
FIG. 3A is an enlarged view illustrating an embodiment of the protective film of FIG. 1.
Figure 3B:
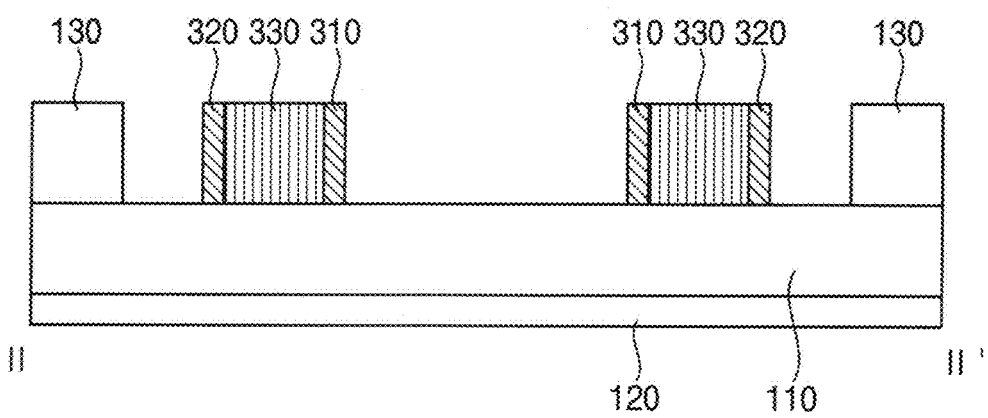
FIG. 3B is a cross-sectional view taken along line II-II' of FIG. 3A.

FIG. 3A is an enlarged view illustrating an embodiment of the protective film of FIG. 1. FIG. 3B is a cross-sectional view taken along line II-II' of FIG. 3A. Specifically, FIG. 3A may correspond to an enlarged view of area A of FIG. 1.

Referring to FIGS. 3A, and 3B, in an embodiment, the second film layer 130 may include a first film piece 310 disposed inside the through hole 140 and having a circular shape, a second film piece 320 surrounding the first film piece 310, and a third film piece 330 extending from the first film piece 310 to the second film piece 320. In such an embodiment, while maintaining an elongation force of the first film layer 110, the protective film 100 may be adhered in close contact with the window (for example, a window 710 of FIG. 9).

Figure 4A:
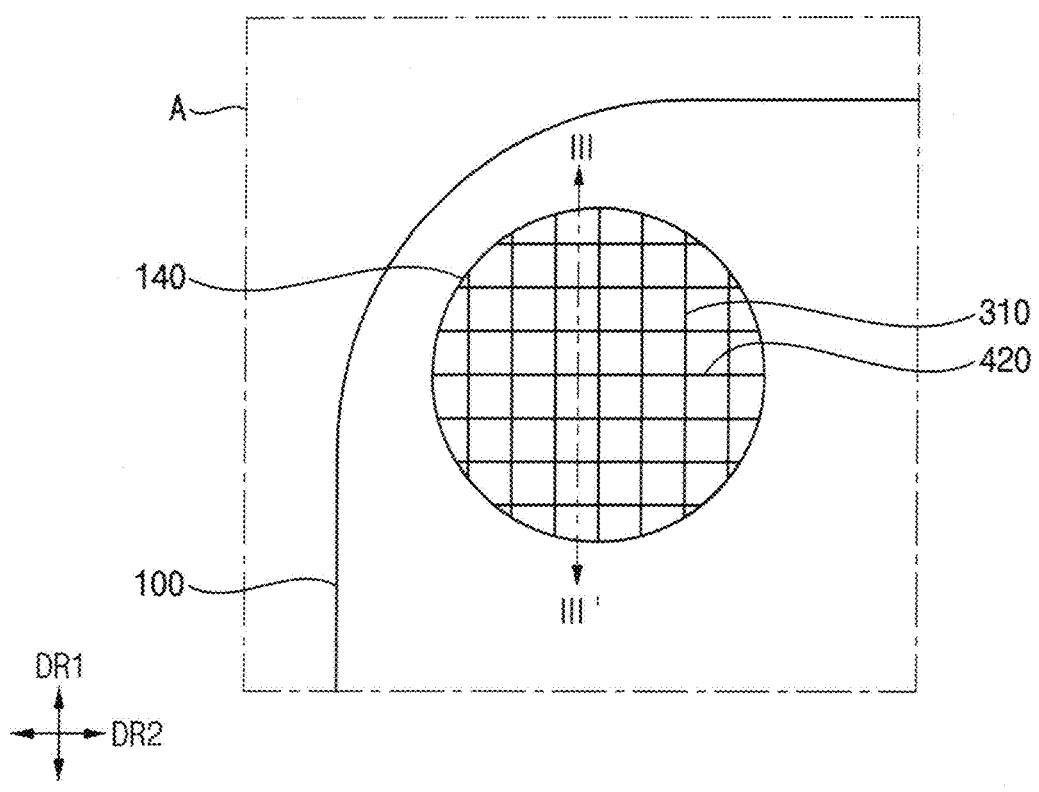
FIG. 4A is an enlarged view illustrating an alternative embodiment of the protective film of FIG. 1.
Figure 4B:
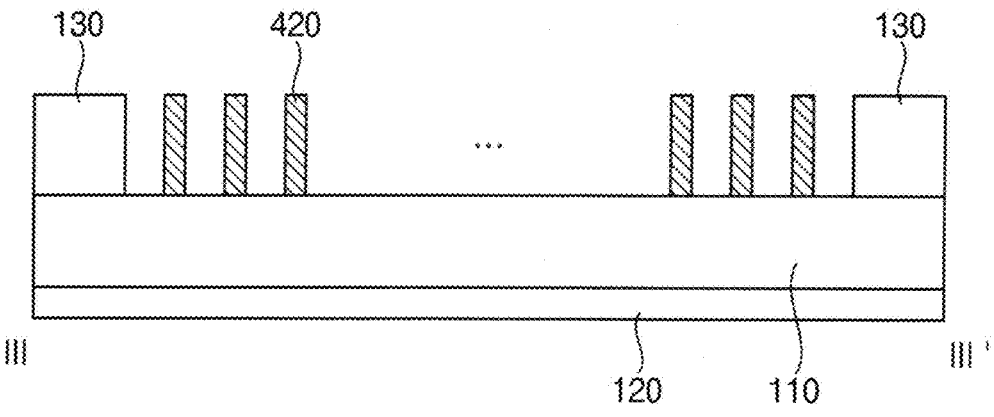
FIG. 4B is a cross-sectional view taken along line III-III' of FIG. 4A.

FIG. 4A is an enlarged view illustrating an alternative embodiment of the protective film of FIG. 1. FIG. 4B is a cross-sectional view taken along line III-III' of FIG. 4A. Specifically, FIG. 4A may correspond to an enlarged view of area A of FIG. 1.

Referring to FIGS. 4A, and 4B, in an embodiment, the second film layer 130 may include a plurality of first film extensions 410 disposed inside the through hole 140 and extending in the first direction DR1, and a plurality of second film extensions 420 disposed inside the through hole 140 and extending in a second direction DR2 perpendicular to the first direction DR1. In such an embodiment, while maintaining an elongation force of the first film layer 110, the protective film 100 may be adhered in close contact with the window (for example, the window 710 of FIG. 9).

Figure 5A:
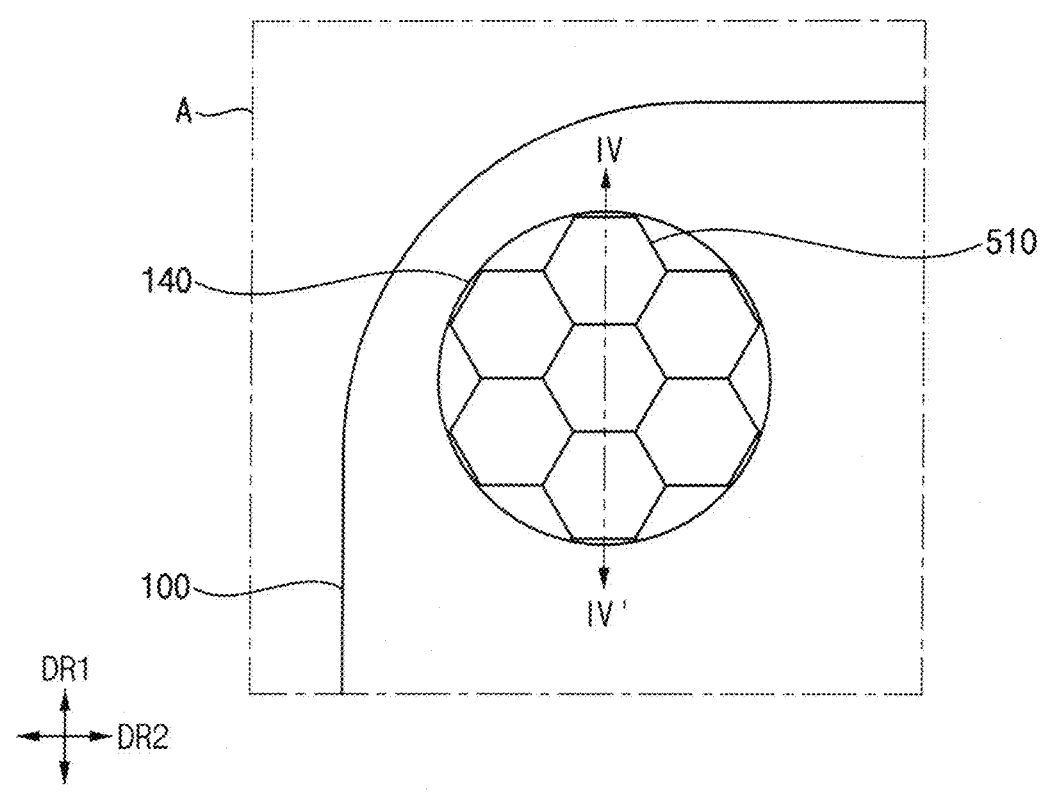
FIG. 5A is an enlarged view illustrating another alternative embodiment of the protective film of FIG. 1.
Figure 5B:
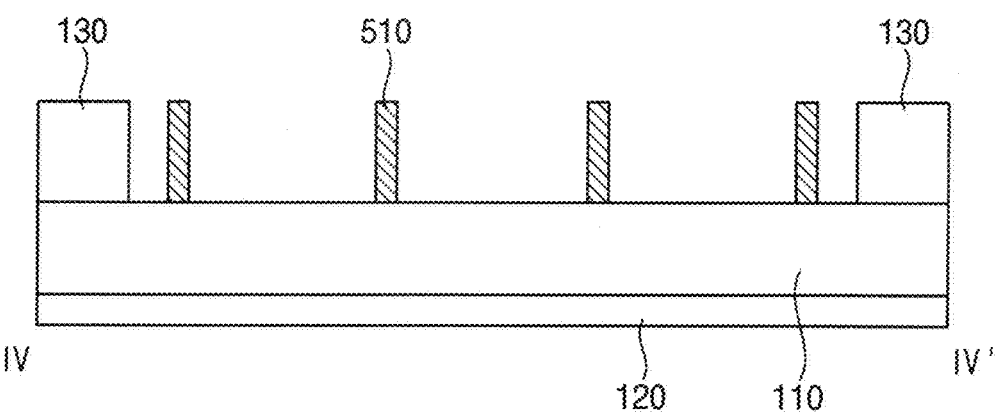
FIG. 5B is a cross-sectional view taken along line IV-IV of FIG. 5A.

FIG. 5A is an enlarged view illustrating another alternative embodiment of the protective film of FIG. 1. FIG. 5B is a cross-sectional view taken along line IV-IV' of FIG. 5A. Specifically, FIG. 5A may correspond to an enlarged view of area A of FIG. 1.

Referring to FIGS. 5A, and 5B, in an embodiment, the second film layer 130 may include a plurality of film patterns 510 disposed inside the through hole 140 and having a hexagonal shape. In such an embodiment, while maintaining an elongation force of the first film layer 110, the protective film 100 may be adhered in close contact with the window (for example, the window 710 of FIG. 9).

Figure 6A:
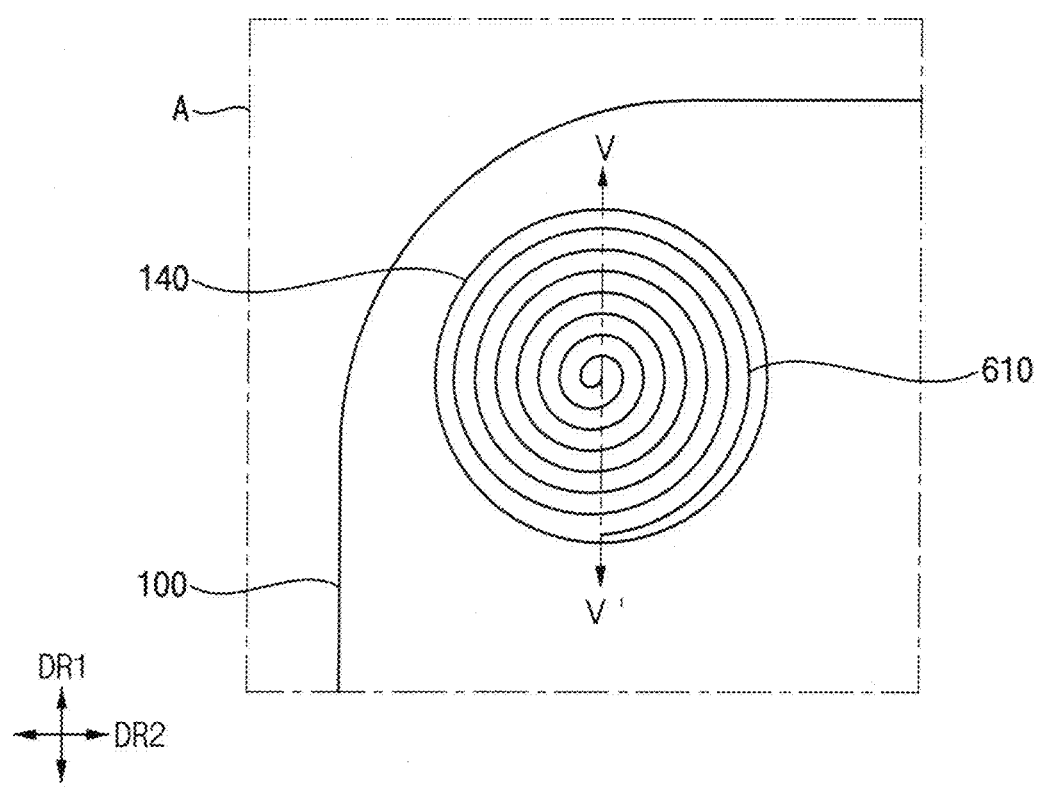
FIG. 6A is an enlarged view illustration still another alternative embodiment of the protective film of FIG. 1.
Figure 6B:
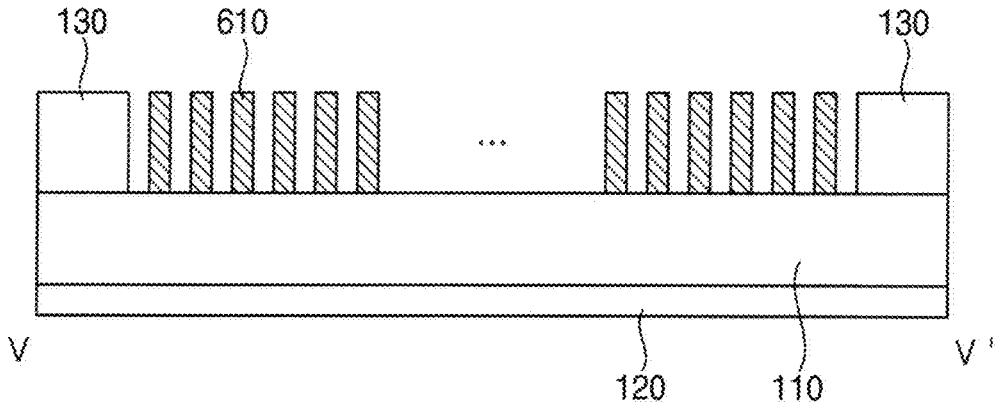
FIG. 6B is a cross-sectional view taken along line V-V' of FIG. 6A.

FIG. 6A is an enlarged view illustration still another alternative embodiment of the protective film of FIG. 1. FIG. 6B is a cross-sectional view taken along line V-V' of FIG. 6A. Specifically, FIG. 6A may correspond to an enlarged view of area A of FIG. 1.

Referring to FIGS. 6A, and 6B, in an embodiment, the second film layer 130 may include a film pattern 610 disposed inside the through hole 140 and having a spiral shape. In such an embodiment, while maintaining an elongation force of the first film layer 110, the protective film 100 may be adhered in close contact with the window (for example, the window 710 of FIG. 9).

Figure 7A:
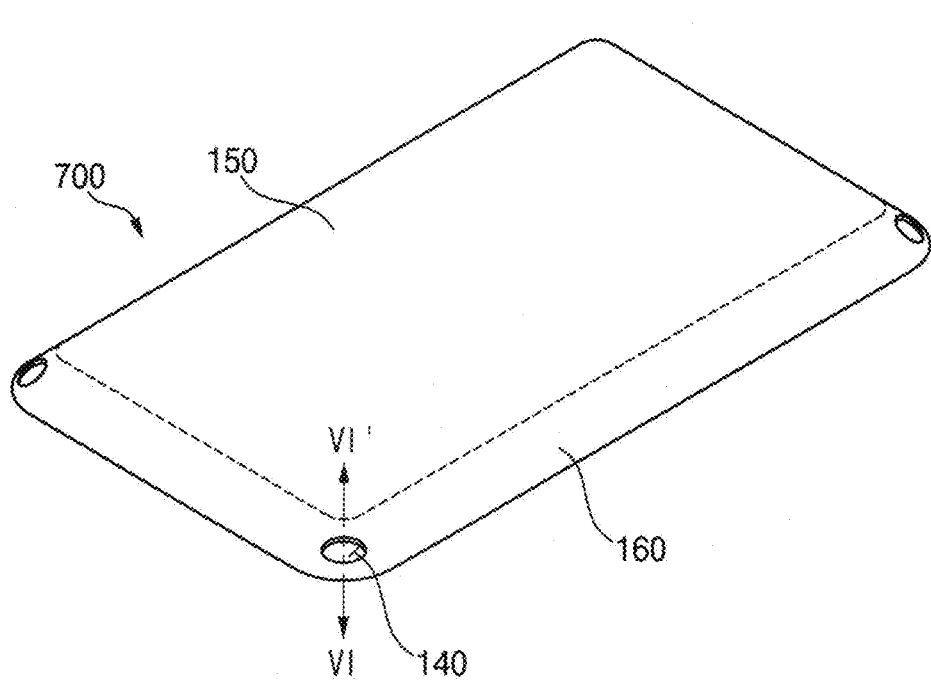
FIG. 7A is a perspective view illustrating an embodiment of a display device including the protective film of FIG. 1.
Figure 7B:
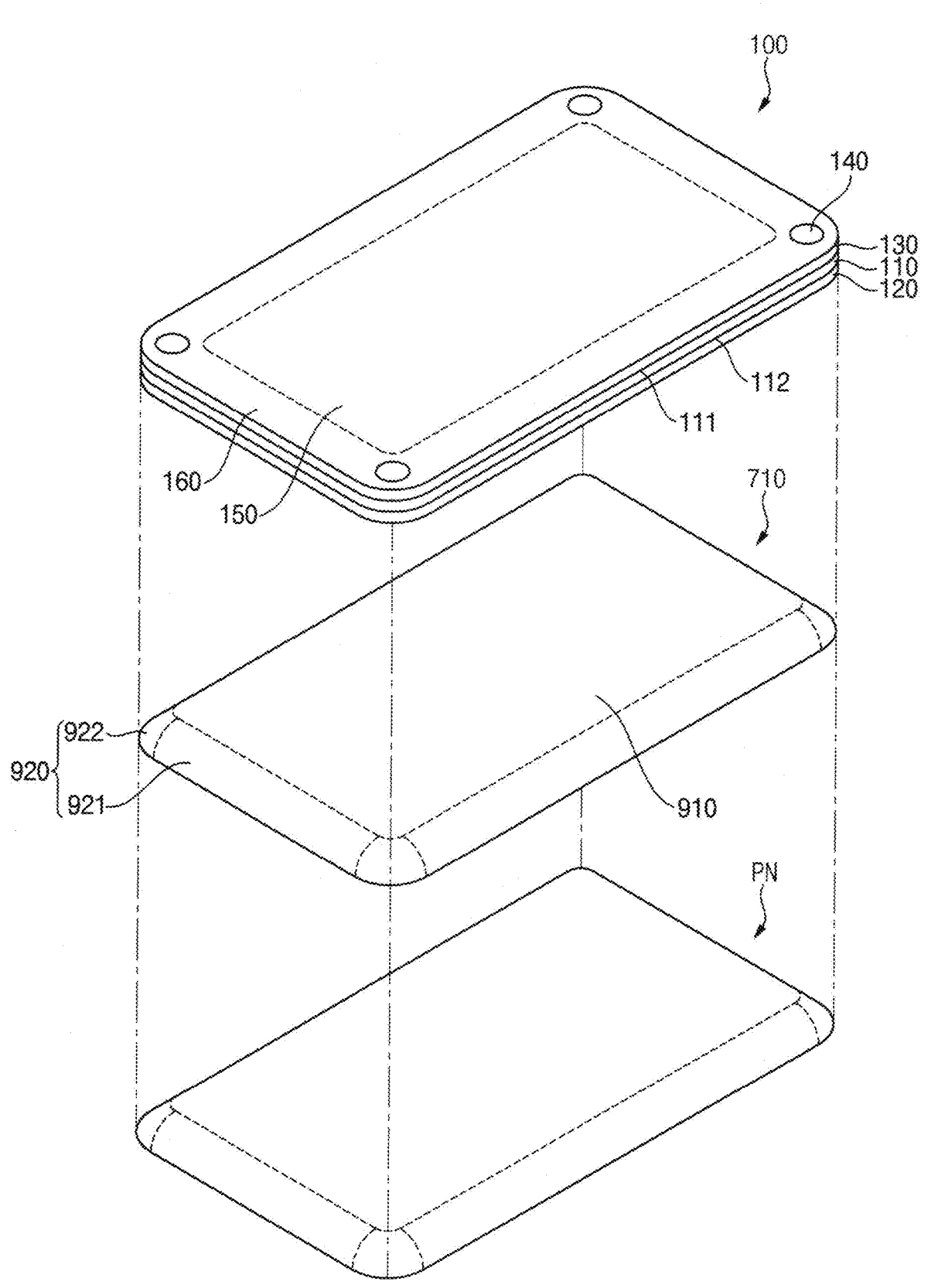
FIG. 7B is a diagram illustrating a stacked structure of the protective film, a window, and a display panel included in the display device of FIG. 7A.
Figure 8:
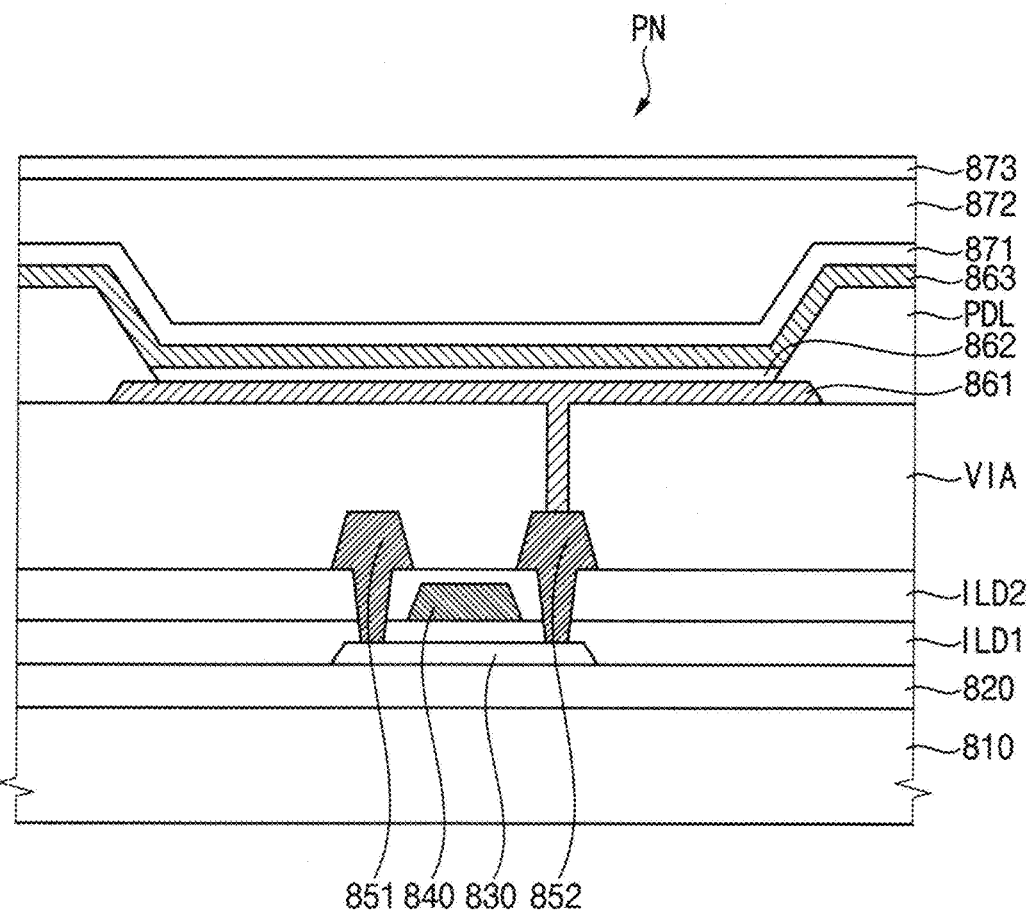
FIG. 8 is a cross-sectional view illustrating the display panel included in the display device of FIG. 7B.
Figure 10:
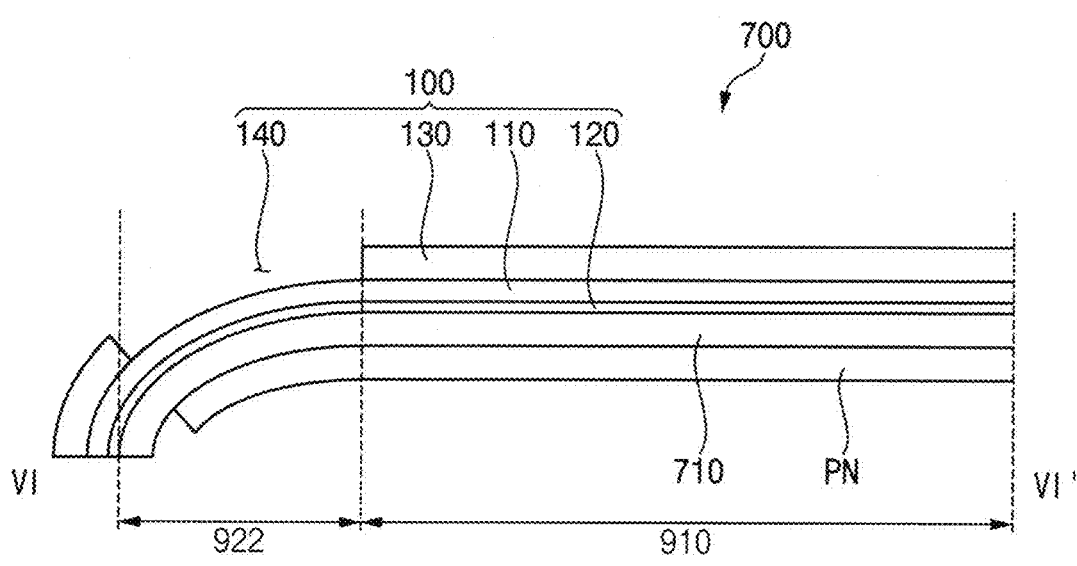
FIG. 10 is a cross-sectional view taken along line VI-VI' of FIG. 7A.

FIG. 7A is a perspective view illustrating an embodiment of a display device including the protective film of FIG. 1. FIG. 7B is a diagram illustrating a laminated structure of the protective film, a window, and a display panel included in the display device of FIG. 7A. FIG. 8 is a cross-sectional view illustrating the display panel included in the display device of FIG. 7B. FIG. 9 is a perspective view illustrating the window included in the display device of FIG. 7B. FIG. 10 is a cross-sectional view taken along line VI-VI' of FIG. 7A.

Referring to FIGS. 7A, and 7B, an embodiment of a display device 700 may include the protective film 100, a window 710, and a display panel PN.

The protective film 100 may include a first film layer 110, a second film layer 130 disposed on a first surface 111 of the first film layer 110, and an adhesive layer 120 disposed on a second surface 112 opposite to the first surface 111. In such an embodiment, a through hole 140 may be defined through the second film layer 13 to expose the first surface 111 of the first film layer 110.

The protective film 100 may include a central area 150 and an outer area 160. The through hole 140 may be disposed in the outer area 160 of the protective film 100. The central area 150 of the protective film 100 may be attached on a flat area 910 of the window 710. After the protective film 100 is attached to the window 710, the central area 150 of the protective film 100 may have a flat surface. The outer area 160 of the protective film 100 may be attached on a curved area 920 of the window 710. After the protective film 100 is attached to the window 710, the outer area 160 of the protective film 100 may have a curved surface. In such an embodiment, the protective film 100 may have a curved surface having a shape similar to that of the curved area 920 of the window 710 in the outer area 160.

The through hole 140 may be disposed on a second curved area 922 of the window 710. A plurality of curved surfaces may be in the second curved area 922 of the window 710. In an embodiment of the display device 700 according to the invention, since the through hole 140 is disposed on the second curved area 922 of the window 710, the protective film 100 may be adhered in close contact with the window 710.

The window 710 may be disposed on the display panel PN, and may protect the display panel PN from external force. The window 710 may include transparent glass or transparent plastic. In one embodiment, for example, the window 710 may include at least one selected from ultrathin tempered glass ("UTG"), PET, PI, polyethersulfone ("PS"), polyacrylate ("PAR"), polyetherimide ("PEI"), polyethylene naphthalate ("PEN"), polyphenylene sulfide ("PPS"), polyarylate, polycarbonate ("PC") and polyarylene ether sulfone.

Referring to FIGS. 7B, and 8, the display panel PN may include a substrate 810, a buffer layer 820, an active pattern 830, a first insulating layer ILD1, a gate electrode 840, a second insulating layer ILD2, a source electrode 851, a drain electrode 852, a via insulating layer VIA, a first electrode 861, a light emitting layer 862, a second electrode, a pixel defining layer PDL, a first inorganic layer 871, an organic layer 872, and a second inorganic layer 873.

The substrate 810 may include at least one selected from glass, quartz, plastic, etc. In one embodiment, for example, the substrate 810 may be a plastic substrate and may include PI. In an embodiment, the substrate 810 may have a structure in which at least one polyimide layer and at least one barrier layer are alternately stacked one on another.

The buffer layer 820 may be disposed on the substrate 810. The buffer layer 820 may include at least one selected from silicon oxide, silicon nitride, etc. The buffer layer 820 may prevent impurities from being diffused into the active pattern 830.

The active pattern 830 may be disposed on the buffer layer 820. In one embodiment, for example, the active pattern 830 may include at least one selected from a silicon semiconductor, an oxide semiconductor, etc. The silicon semiconductor may include at least one selected from amorphous silicon, polycrystalline silicon, etc. The active pattern 830 may pass a current or block a current in response to a gate signal provided to the gate electrode 840. In one embodiment, for example, ions may be selectively implanted into the active pattern 830. The active pattern 830 may include a source area and a drain area into which the ions are implanted, and a channel area into which the ions are not implanted.

The first insulating layer ILD1 may include an insulating material and may cover the active pattern 830. In one embodiment, for example, the first insulating layer ILD1 may include at least one selected from silicon oxide, silicon nitride, titanium oxide, tantalum oxide, etc. The first insulating layer ILD1 may electrically insulate the active pattern 830 and the gate electrode 840.

The gate electrode 840 may include at least one selected from a metal, an alloy, and a conductive metal oxide, and may be disposed on the first insulating layer ILD1. In one embodiment, for example, the gate electrode 840 may include at least one selected from silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide ("ITO"), indium zinc oxide ("IZO"), etc.

The second insulating layer ILD2 may include an insulating material, and may cover the gate electrode 840. In one embodiment, for example, the second insulating layer ILD2 may include at least one selected from silicon oxide, silicon nitride, titanium oxide, tantalum oxide, etc. The second insulating layer ILD2 may electrically insulate the gate electrode 840 from the source electrode 851 and may electrically insulate the gate electrode 840 from the drain electrode 852.

The source electrode 851 and the drain electrode 852 may include at least one selected from a metal, an alloy, and a conductive metal oxide, and may be disposed on the second insulating material ILD2. In one embodiment, for example, the source electrode 851 and the drain electrode 852 may include at least one selected from silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), Platinum (Pt), scandium (Sc), ITO, indium IZO, etc.

The via insulating layer VIA may cover the source electrode 851 and the drain electrode 852, and may include an organic insulating material, and may have a substantially flat top surface. In one embodiment, for example, the via insulating layer VIA may include at least one selected from photoresist, polyacrylic resin, polyimide resin, acrylic resin, etc.

The first electrode 861 may be disposed on the via insulating layer VIA. The first electrode 861 may include at least one selected from a metal, an alloy, or a conductive metal oxide. In one embodiment, for example, the first electrode 861 may include at least one selected from silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), Scandium (Sc), ITO, IZO, etc. The first electrode 861 may receive a first voltage from the drain electrode 852.

The pixel defining layer PDL may be disposed on the via insulating layer VIA, and an opening may be defined through the pixel defining layer PDL to expose the upper surface of the first electrode 861 may be formed in the pixel defining layer PDL. In one embodiment, for example, the pixel defining layer PDL may include organic material such as a polyimide resin (e.g., photosensitive polyimide resin ("PSPI")), photoresist, polyacrylic resin, acrylic resin, etc.

The light emitting layer 862 may be disposed on the first electrode 861. The light emitting layer 862 may have a multilayer structure including an organic emission layer, a hole injection layer, a hole transport layer, an electron transport layer, and an electron injection layer.

The second electrode 863 may be disposed on the light emitting layer 862, and may receive a second voltage. The second electrode 863 may include at least one selected from a metal, an alloy, a conductive metal oxide, etc. In one embodiment, for example, the second electrode 863 may include at least one selected from silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), ITO, IZO, etc.

Due to a voltage difference between the first voltage and the second voltage, the light emitting layer 862 may generate light. Accordingly, the first electrode 861, the light emitting layer 862, and the second electrode 863 may be collectively defined as organic light emitting diode.

An encapsulation layer may be disposed on the second electrode 863. The encapsulation layer may prevent penetration of moisture and oxygen from the outside. In one embodiment, for example, the encapsulation layer may have a structure in which a first inorganic layer 871, an organic layer 872, and a second inorganic layer 873 are alternately stacked one on another.

Referring to FIGS. 7B, and 9, the window 710 may include a flat area 910 and a curved area 920. The flat area 910 of the window 710 may not have a curvature. The curved area 920 of the window 710 may have a curvature. The curved area 920 may include a first curved area 921 including a single curved surface, that is, a surface curved with a constant radius of curvature, and a second curved area 922 including an area including multiple curved surfaces, that is, an area curved with a plurality of radii of curvature.

Referring to FIGS. 7A, 7B, 9, and 10, the through hole 140 may overlap the window 710 in the second curved area 922. In such an embodiment, a part of the second film layer 130 corresponding to a portion of the protective film 100 attached on the curved area 922 of the window 710 may be removed. Accordingly, the second film layer 130 may not be lifted up in the second curved area 922.

In an embodiment, an elongation rate of the first film layer 110 may be greater than an elongation rate of the second film layer 130. Accordingly, when the protective film 100 is attached on the second curved area 922 of the window 710, bubbles may not occur between the window 710 and the protective film 100 in the second curved area 922.

In an embodiment, as described above with reference to FIGS. 3, 4, 5, and 6, the second film layer 300 may include a first film piece 310 disposed inside the through hole 140 and having a circular shape, a second film piece 320 surrounding the first film piece 310, and a third film piece 330 extending from the first film piece 310 to the second film piece 320. In an alternative embodiment, the second film layer 130 may include a plurality of first film extensions 410 disposed inside the through hole 140 and extending in the first direction DR1, and a plurality of second film extensions 420 disposed inside the through hole 140 and extending in a second direction DR2 perpendicular to the first direction DR1. In another alternative embodiment, the second film layer 130 may include a plurality of film patterns 510 disposed inside the through hole 140 and having a hexagonal shape. In another alternative embodiment, the second film layer 130 may include film pattern 610 disposed inside the through hole 140 and having a spiral shape. Accordingly, in such embodiments, while maintaining an elongation force of the first film layer 110, the protective film 100 may be adhered in close contact with the window 710.

Figure 11:
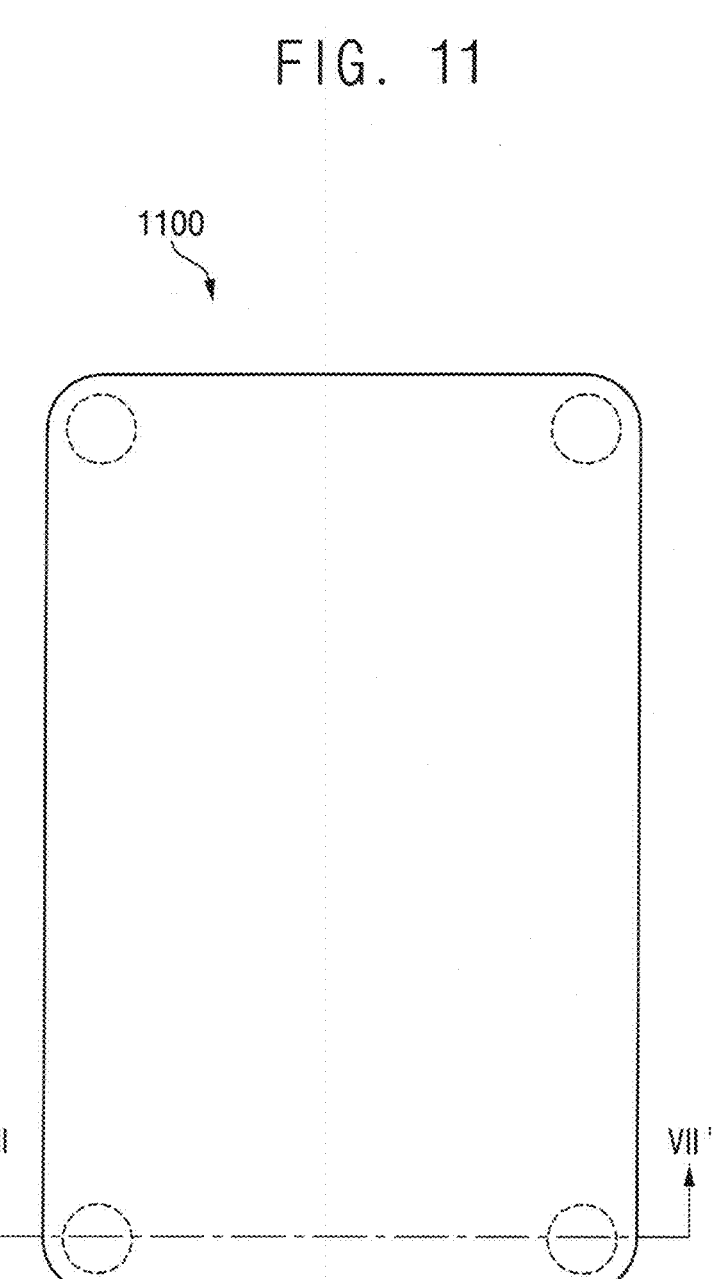
FIG. 11 is a plan view illustrating a protective film according to an alternative embodiment.
Figure 12:
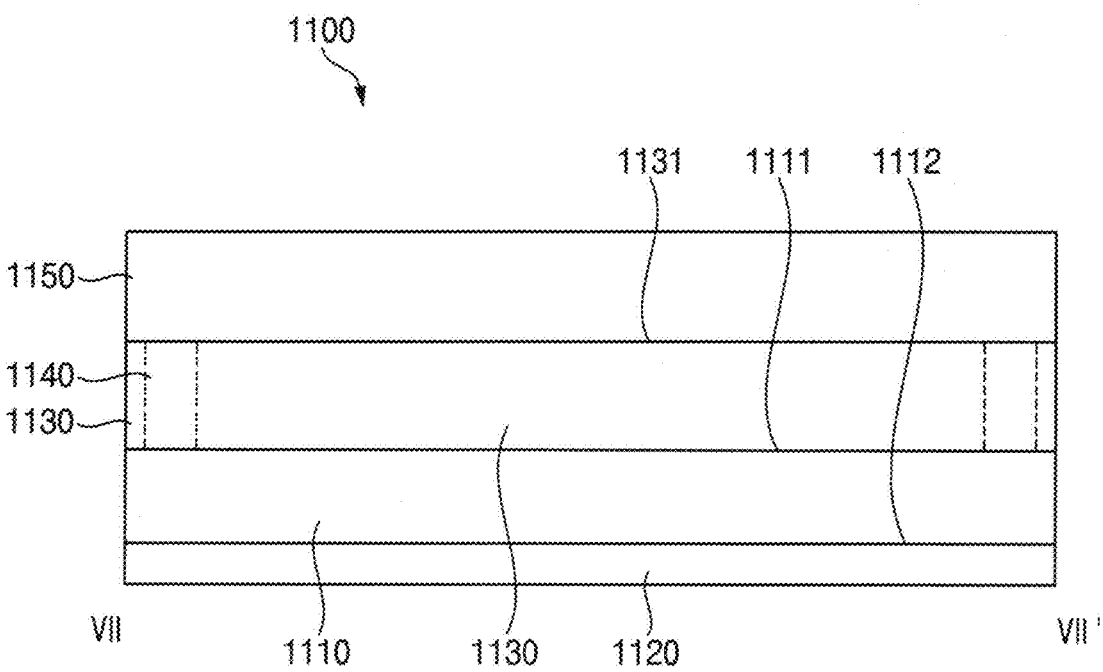
FIG. 12 is a cross-sectional view taken along line VII-VII' of FIG. 11.

FIG. 11 is a plan view illustrating a protective film according to an alternative embodiment. FIG. 12 is a cross-sectional view taken along line VII-VII' of FIG. 11.

Referring to FIGS. 11, and 12, an embodiment of a protective film 1100 may include a first film layer 1110, a second film layer 1130 disposed on a first surface 1111 of the first film layer 1110, an adhesive layer 1120 disposed on a second surface 1112 opposite to the first surface 1111 of the first film layer 1110, and a third film layer 1150 disposed on a third surface 1131 of the second film layer 1130. The protective film 1100 may be adhered to the window (for example, a window 710 of FIG. 9) through the adhesive layer 1120. In such an embodiment, a through hole 1140 may be defined through the second film layer 1130 to expose the first surface 1111 of the first film layer 1110.

In such an embodiment, the third film layer 1150 may include PE. Accordingly, an elongation rate of the third film layer 1150 may be equal to or greater than an elongation rate of the first film layer 1110. In such an embodiment, the window may be protected by the first film layer 1110 and the third film layer 1150 in the curved area (for example, the second curved area 922 in FIG. 9).

Embodiments of the invention may be applied to any display device and an electronic device including the same. For example, embodiments of the invention may be applied to a high-resolution smartphone, a mobile phone, a smart pad, a smart watch, a tablet personal computer ("PC"), a vehicle navigation system, a television and a computer monitor, etc.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
a display panel;
a window disposed on the display panel; and
a protective film disposed on the window, wherein the protective film comprises a first film layer, a second film layer disposed on a first surface of the first film layer, and adhesive layer disposed on a second surface of the first film layer, which is opposite to the first surface,
wherein the a through hole is defined through the second film layer to expose the first surface of the first film layer.

2. The display device of claim 1, wherein
the window comprises a flat area and a curved area surrounding the flat area, and
the through hole is defined in the curved area.

3. The display device of claim 1, wherein an elongation rate of the first film layer is greater than an elongation rate of the second film layer.

4. The display device of claim 1, wherein the first film layer comprises polyethylene.

5. The display device of claim 1, wherein the second film layer comprises polyethylene terephthalate.

6. The display device of claim 1, wherein the second film layer further comprises:
a first film piece disposed inside the through hole and having a circular shape;
a second film piece surrounding the first film piece; and
a third film piece extending from the first film piece to the second film piece.

7. The display device of claim 1, wherein the second film layer further comprises:
a plurality of first film extensions disposed inside the through hole and extending in a first direction; and
a plurality of second film extensions disposed inside the through hole and extending in a second direction perpendicular to the first direction.

8. The display device of claim 1, wherein the second film layer further comprises:
a plurality of film patterns disposed inside the through hole and having a hexagonal shape.

9. The display device of claim 1, wherein the second film layer further comprises:
a film pattern disposed inside the through hole and having a spiral shape.

* * * * *